United States Patent
Lee et al.

(10) Patent No.: US 9,595,331 B1
(45) Date of Patent: Mar. 14, 2017

(54) NONVOLATILE MEMORY DEVICE

(71) Applicant: SK hynix Inc., Gyeonggi-do (KR)

(72) Inventors: Go-Hyun Lee, Gyeonggi-do (KR); Jin Ho Kim, Gyeonggi-do (KR); Ji Hui Baek, Gyeonggi-do (KR); Sung Wook Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/019,450

(22) Filed: Feb. 9, 2016

(30) Foreign Application Priority Data

Oct. 26, 2015 (KR) ........................ 10-2015-0148412

(51) Int. Cl.
*G11C 16/08* (2006.01)
*G11C 16/04* (2006.01)
*G11C 16/28* (2006.01)
*G11C 16/10* (2006.01)

(52) U.S. Cl.
CPC .......... *G11C 16/0483* (2013.01); *G11C 16/10* (2013.01); *G11C 16/28* (2013.01)

(58) Field of Classification Search
CPC ...................................................... G11C 16/08
USPC ........................................ 365/185.11, 185.13
See application file for complete search history.

(56) References Cited

U.S. PATENT DOCUMENTS

| | | | | |
|---|---|---|---|---|
| 9,214,210 B2* | 12/2015 | Chu | .......................... | G11C 8/12 |
| 2001/0054737 A1* | 12/2001 | Nakamura | ......... | G11C 16/0483 257/315 |
| 2006/0083062 A1* | 4/2006 | Park | ...................... | G11C 16/30 365/185.11 |
| 2012/0069683 A1* | 3/2012 | Kamata | ............... | G11C 11/5642 365/185.25 |
| 2013/0215684 A1* | 8/2013 | Oh | .................... | H01L 27/11582 365/185.29 |
| 2015/0092494 A1* | 4/2015 | Rhie | ...................... | G11C 16/16 365/185.12 |
| 2015/0262669 A1* | 9/2015 | Kamata | ............... | G11C 16/0483 365/185.05 |
| 2015/0287437 A1* | 10/2015 | Park | ...................... | G11C 5/025 365/51 |
| 2016/0118123 A1* | 4/2016 | Jung | ...................... | G11C 16/10 365/185.11 |
| 2016/0172037 A1* | 6/2016 | Lee | ...................... | G11C 15/046 365/185.12 |

FOREIGN PATENT DOCUMENTS

KR 1020100065996 6/2010

* cited by examiner

*Primary Examiner* — Son Mai
(74) *Attorney, Agent, or Firm* — IP & T Group LLP

(57) ABSTRACT

A nonvolatile memory device may include a plurality of memory blocks each including a drain select line, word lines and a source select line, and a pass transistor stage including a plurality of pass transistors formed in series in an active region and suitable for transferring word line voltages to a memory block selected among the memory blocks, in response to a block select signal, wherein the pass transistors each share a drain with a first adjacent pass transistor at one side while sharing a source with a second adjacent pass transistor at the other, and wherein a pair of pass transistors which share the source transfer word line driving signal form drains thereof to a pair of word lines which are included in different memory blocks among the memory blocks, through the source.

20 Claims, 16 Drawing Sheets

NONVOLATILE MEMORY DEVICE

CROSS-REFERENCE TO RELATED APPLICATION

The present application claims priority under 35 U.S.C. §119(a) to Korean Patent Application No. 10-2015-0148412 filed in the Korean Intellectual Property Office on Oct. 26, 2015, which is herein incorporated by reference in its entirety.

BACKGROUND

1. Technical Field

Various embodiments generally relate to a semiconductor memory device and more particularly, to a nonvolatile memory device.

2. Related Art

Semiconductor memory devices may be realized using semiconductor materials such as silicon (Si), germanium (Ge), gallium arsenide (GaAs) and indium phosphide (InP). Semiconductor memory devices are generally classified into volatile and nonvolatile memory devices.

A volatile memory device does not retain stored data when its power supply is turned off. Examples of volatile memory devices include SRAM (static RAM), DRAM (dynamic RAM) and SDRAM (synchronous DRAM) devices. A nonvolatile memory device retains stored data even when its power supply is turned off. Examples of nonvolatile memory devices include ROM (read only memory), PROM (programmable ROM), EPROM (erasable programmable ROM), EEPROM (electrically erasable programmable ROM), flash memory, PRAM (phase change RAM), MRAM (magnetoresistive RAM), RRAM (resistive RAM), and FRAM (ferroelectric RAM) devices.

SUMMARY

In an embodiment, a nonvolatile memory device may include a plurality of memory blocks each including a drain select line, word lines and a source select line, and a pass transistor stage including a plurality of pass transistors formed in series in an active region and suitable for transferring word line voltages to a memory block selected among the memory blocks, in response to a block select signal, wherein the pass transistors each share a drain with a first adjacent pass transistor at one side while sharing a source with a second adjacent pass transistor at the other, and wherein a pair of pass transistors which share the source transfer word line driving signals from drains thereof to a pair of word lines which are included in different memory blocks among the memory blocks, through the source.

DETAILED DESCRIPTION

Hereinafter, various embodiments of the present invention are described with reference to the accompanying drawings.

Figure 1:
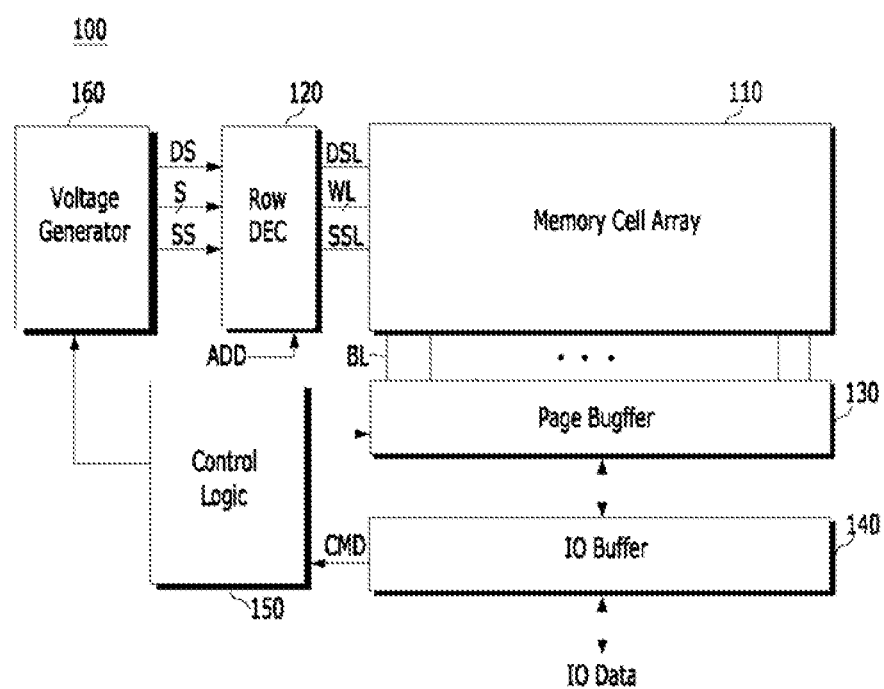
FIG. 1 is a block diagram illustrating a nonvolatile memory device, according to an embodiment of the invention.

Referring to FIG. 1 a nonvolatile memory device 100 is provided, according to an embodiment of the invention. The nonvolatile memory device 100 may include a memory cell array 110, a row decoder 120, a page buffer 130, an input/output buffer 140, a control logic 150, and a voltage generator 160.

The memory cell array 110 may be coupled to the row decoder 120 through a plurality of word lines WL. The memory cell array 110 may also be coupled to the row decoder 120 through one or more drain select and source select lines DSL, SSL, hereinafter also referred to generally as select lines DSL, SSL. The memory cell array 110 may be coupled to the page buffer 130 through a plurality of bit lines BL.

The memory cell array 110 may include a plurality of memory blocks. Each of the plurality of memory blocks may correspond to an erase unit. Each of the memory blocks may include a plurality of cell strings. A cell string is group of memory cells coupled in series. Memory cells included in one cell string may be selected by the same select transistor.

The row decoder 120 may select a memory block of the memory cell array 110 in response to an address ADD. The row decoder 120 may select a word line WL of a selected memory block in response to an address ADD. The row decoder 120 may transfer a driving signal from the voltage generator 160, to a selected word line WL of a selected memory block. The row decoder 120 may transfer a driving signal from the voltage generator 160 to the select lines DSL, SSL. In particular, for example, a high voltage driving signal may be provided to a selected word line WL of a selected memory block. For transferring a high voltage driving signal, the row decoder 120 may include one or more pass transistors that may be or comprise high voltage transistors.

According to an embodiment, the footprint of the row decoder 120 i.e. the area occupied by the row decoder 120, may be reduced through modification in the positioning or layout structure of the pass transistors.

The page buffer 130 may operate as a write driver or a sense amplifier depending on the operation modes of the nonvolatile memory device. In a program operation, the page buffer 130 may transfer a voltage corresponding to data to be programmed, to a bit line BL of the memory cell array 110. In a read operation, the page buffer 130 senses data stored in a selected memory cell, through a bit line BL, and may transfer the sensed data to the input/output buffer 140. In an erase operation, the page buffer 130 may float bit lines BL of the memory cell array 110.

In a program operation, the input/output buffer 140 may transfer data inputted from an external device, to the page buffer 130. In a read operation, the input/output buffer 140 may output data provided from the page buffer 130, to an external device. The input/output buffer 140 may transfer an address ADD or a command CMD to the row decoder 120 or the control logic 150.

The control logic 150 may control the page buffer 130 and the voltage generator 160 for accessing selected memory cells in response to a command CMD transferred from the input/output buffer 140.

The voltage generator 160 may generate a voltage S to be supplied to a selected word line WL, under the control of the control logic 150. Different level voltages may be generated by the voltage generator as may be needed. The voltage generator 160 may generate one or more voltages to be supplied to one or more word lines at a time. The voltage generator 160 may generate a voltage to be supplied to a bulk in which memory cells are formed, for example, a well region, under the control of the control logic 150. Examples, of word line voltages S to be supplied to respective word lines WL may include a program voltage Vpgm, a pass voltage Vpass, a selected read voltage Vrd and/or an unselected read voltage Vread. The voltage generator 160 may generate select signals DS, SS which may provided to the select lines DSL and SSL, respectively, in a read and/or a program operation. For example, the first select signal DS may be a control signal for selecting a cell string, while the second select signal SS may be a ground select signal.

Figure 2:
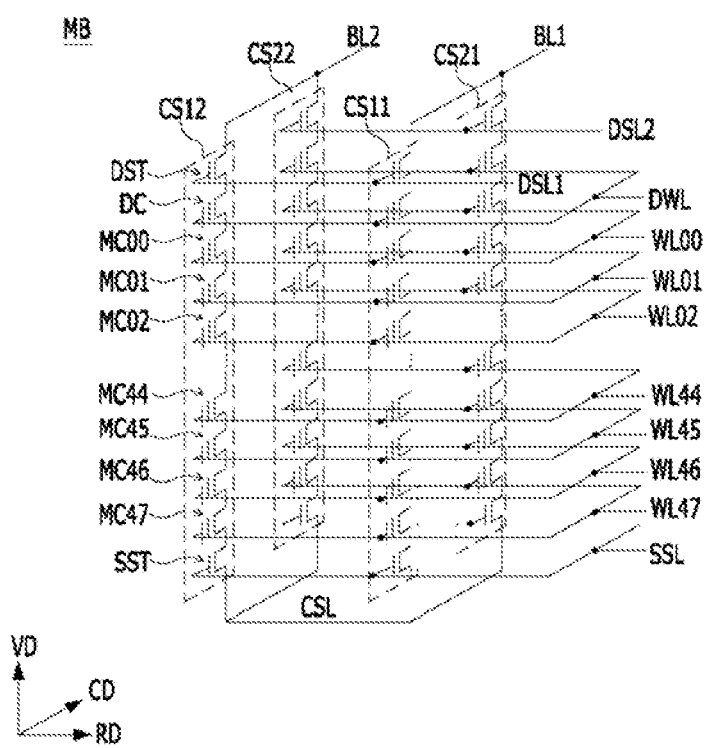
FIG. 2 is a circuit diagram illustrating a memory block included in the memory cell array shown in FIG. 1, according to an embodiment of the invention.

Referring now to FIG. 2 a circuit diagram for the memory block MB included in the memory cell array 110 of FIG. 1 is provided.

FIG. 2 illustrates, as an example, that the memory cell array 110 may be a three-dimensional memory cell array. However, it is noted that the memory cell array 110 may be provided as a two-dimensional memory cell array.

The memory block MB may include a plurality of cell strings CS11, CS12, CS21 and CS22. Each of the plurality of cell strings CS11, CS12, CS21 and CS22 may include a drain select transistor DST, a source select transistor SST and a plurality of memory cells DC and MC00 to MC47 which may be disposed perpendicularly with respect to the main surface of a substrate (not shown). For example, the various parts of each cell string may be stacked in a vertical orientation. In each of the cell strings CS11, CS12, CS21 and CS22, the memory cells DC and MC00 to MC47 may be coupled in series between the drain select transistor DST and the source select transistor SST. Among the memory cells DC and MC00 to MC47, the memory cells MC00 to MC47 may represent main memory cells that are used for storing valid data. The memory cell DC may represent a dummy memory cell not used for storing valid data. For example, a dummy memory cell may store dummy data.

The gates of the source select transistors SST of the plurality of cell strings CS11, CS12, CS21 and CS22 may be coupled in common to a source select line SSL. One of the ends of the source select transistors SST may be coupled to the main memory cells MC47, and the other of the ends may be couple to a common source line CSL.

The gates of the drain select transistors DST of the cell strings CS11 and CS12 may be coupled to a drain select line DSL1. Similarly, the gates of the drain select transistors DST of the cell strings CS21 and CS22 may be coupled to a drain select line DSL2.

One of the ends of the drain select transistors DST of the cell strings CS11 and CS21 may be coupled to a bit line BL1, while the other of the ends may be coupled to the dummy memory cells DC. One of the ends of the drain select transistors DST of the cell strings CS12 and CS22 may be coupled to a bit line BL2, while the other of the ends may be coupled to the dummy memory cells DC.

For facilitating explanation, in the following descriptions, row, column and height directions are defined.

The direction in which the drain select lines DSL1, DSL2 extend may be a row direction RD. Hence, for example, the cell strings CS11 and CS12 may be arranged in the row direction RD, and may form a first row. Or, also for example, the cell strings CS21 and CS22 may be arranged in the row direction RD, and may form a second row.

The direction in which the bit lines BL1, BL2 extend may be a column direction CD. Hence, for example, the cell strings CS11 and CS21 may be arranged in the column direction CD, and may form a first column while the cell strings CS12 and CS22 may be arranged in the column direction CD, and may form a second column.

A direction from the source select transistors SST to the drain select transistors DST may be a height direction VD.

The memory cells DC and MC00 to MC47 may form a three-dimensional structure as they are arranged in the column direction CD and the row direction RD and are stacked in the height direction VD. Main memory cells MC of the same height may be coupled in common to one word line WL. Main memory cells MC of different heights may be coupled to different corresponding word lines WL. Similarly, the dummy memory cells DC of the same height may be coupled in common to one dummy word line DWL.

Drain select transistors DST of the same row may be coupled in common to one drain select line DSL1 or DSL2, while drain select transistors DST of different rows may be coupled to different, corresponding drain select lines DSL1 and DSL2. Drain select transistors DST of the same column may be coupled in common to one bit line BL1 or BL2, while drain select transistors DST of different columns may be coupled to different, corresponding bit lines BL1 and BL2.

FIG. 2 shows, as an example, that the memory block MB may include 4 cell strings CS11, CS12, CS21 and CS22. However, it is noted that the number of cell strings of the memory block MB is not limited to such an example, and two or more cell strings may be provided in the column direction CD or the row direction RD.

Further, FIG. 2 shows, as an example, that the source select transistors SST are coupled in common to one source select line SSL. However, it is to be noted that, similarly to the drain select transistors DST, the structure of the memory block MB may be changed and applied such that source select transistors SST of the same row are coupled in common to one source select line and source select transistors SST of different rows are coupled to different source select lines, respectively.

Furthermore, FIG. 2 shows as an example that one drain select transistor DST and one source select transistor SST may be provided in each cell string. However, it is to be noted that two or more drain select transistors or two or more source select transistors may be provided in each cell string.

Moreover, FIG. 2 shows as an example that one dummy memory cell DC and 48 main memory cells MC00 to MC47 are included in each cell string. However, it is to be noted that one or more main memory cells may be included in each cell string and no dummy memory cell or two or more dummy memory cells may be included in each cell string.

Figure 3:
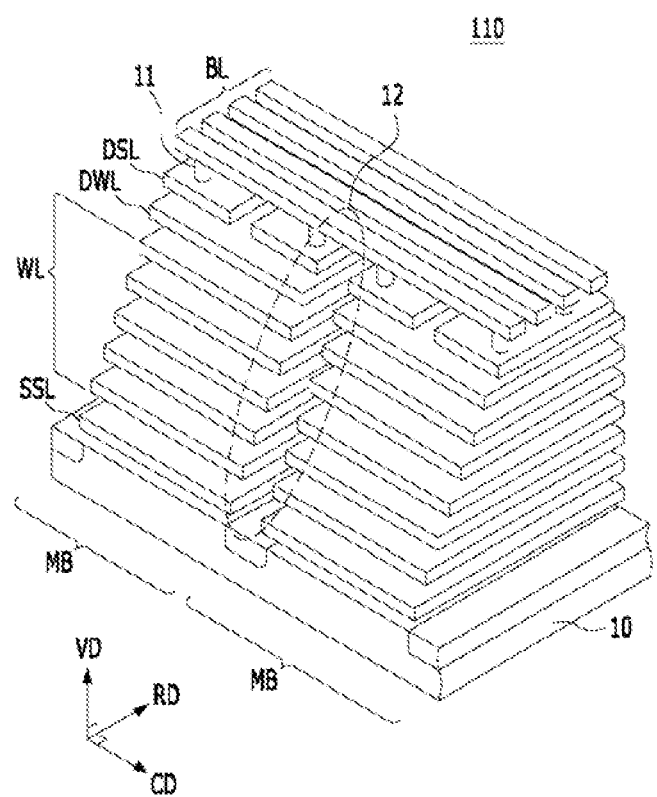
FIG. 3 is a perspective view illustrating a portion of the memory cell array shown in FIG. 1, according to an embodiment of the invention.

FIG. 3 is a perspective view of a portion of the memory cell array 110 shown in FIG. 1.

Referring to FIG. 3, the memory cell array 110 may include a plurality of channels 11 extending perpendicularly, for example, protrude, from a substrate 10, a plurality of select lines DSL and SSL and a plurality of word lines DWL and WL stacked along the channels 11, and bit lines BL which are electrically coupled with the channels 11.

The bottom ends of the channels 11 may be electrically coupled to the substrate 10. The top ends of the channels 11 may be electrically coupled to the bit lines BL by the medium of bit line contacts (not shown). The bit lines BL may extend in the column direction CD. Each of the bit lines BL may be coupled in common to the channels 11 of different memory blocks MB.

The memory cell array 110 may be included in a semiconductor memory device that further may include memory layers (not shown) provided between the channels 11 and the word lines DWL and WL, for example, a NAND flash memory device or a resistive memory device.

The select lines DSL and SSL may include source select lines SSL that are adjacent to the substrate 10 and drain select lines DSL that are adjacent to the bit lines BL. The word lines DWL and WL may include main word lines WL and dummy word lines DWL disposed between the source select lines SSL and the drain select lines DSL.

The select lines DSL and SSL and the word lines DWL and WL may be electrically coupled, for example, with metal lines (not shown) by the medium of contact plugs (not shown). In order to provide pads that are brought into contact with the contact plugs, the select lines DSL, SSL and the word lines DWL, WL may be stacked in the form of a pyramid such that the edges of the select lines DSL, SSL and the word lines DWL, WL may be exposed in the form of a stair. The exposed edges of the select lines DSL, SSL and the word lines DWL, WL may be referred to as a slimming region.

The drain select lines DSL may have the form of a line extending in a direction crossing with the bit lines BL. For example, the bit lines BL may extend in the column direction CD, while the drain select lines DSL may extend in the row direction RD.

The word lines DWL, WL and the source select lines SSL may be cut by a wide cutting part 12 formed in the row direction RD, and may be divided into the memory blocks MB.

The word line voltages S generated by the voltage generator 160 as described above with reference to FIG. 1 may be transferred to the word lines DWL, WL. The word line voltages S may include a program voltage Vpgm, an unselected read voltage Vread, a read voltage Vrd, a pass voltage Vpass and a verify voltage Vfy. The unselected read voltage Vread may be a voltage provided to an unselected word line in a read operation. The read voltage Vrd may be a voltage provided to a selected word line in a read operation.

The program voltage Vpgm, the pass voltage Vpass or the unselected read voltage Vread may correspond to a relatively high voltage. Therefore, pass transistors capable of withstanding a high voltage may be included in the row decoder 120 described above with reference to FIG. 1.

A high voltage transistor forming a pass transistor may have a longer channel than a low voltage transistor, for withstanding a high voltage, that is, for preventing a punch-through between its source and drain. Also, a high voltage transistor may have a thicker gate oxide layer than a low voltage transistor, for withstanding the high voltage, that is, for withstanding a high potential difference between its gate and its drain and/or its gate and its source. In other words, a high voltage transistor may need a wider chip area than a low voltage transistor.

For this reason, even through the size of a memory cell may shrink through fine processing, it is not easy to decrease the size of a pass transistor for providing a high voltage. The exemplary embodiment provides a technology capable of decreasing the footprint of pass transistors by changing their layout.

Figure 4:
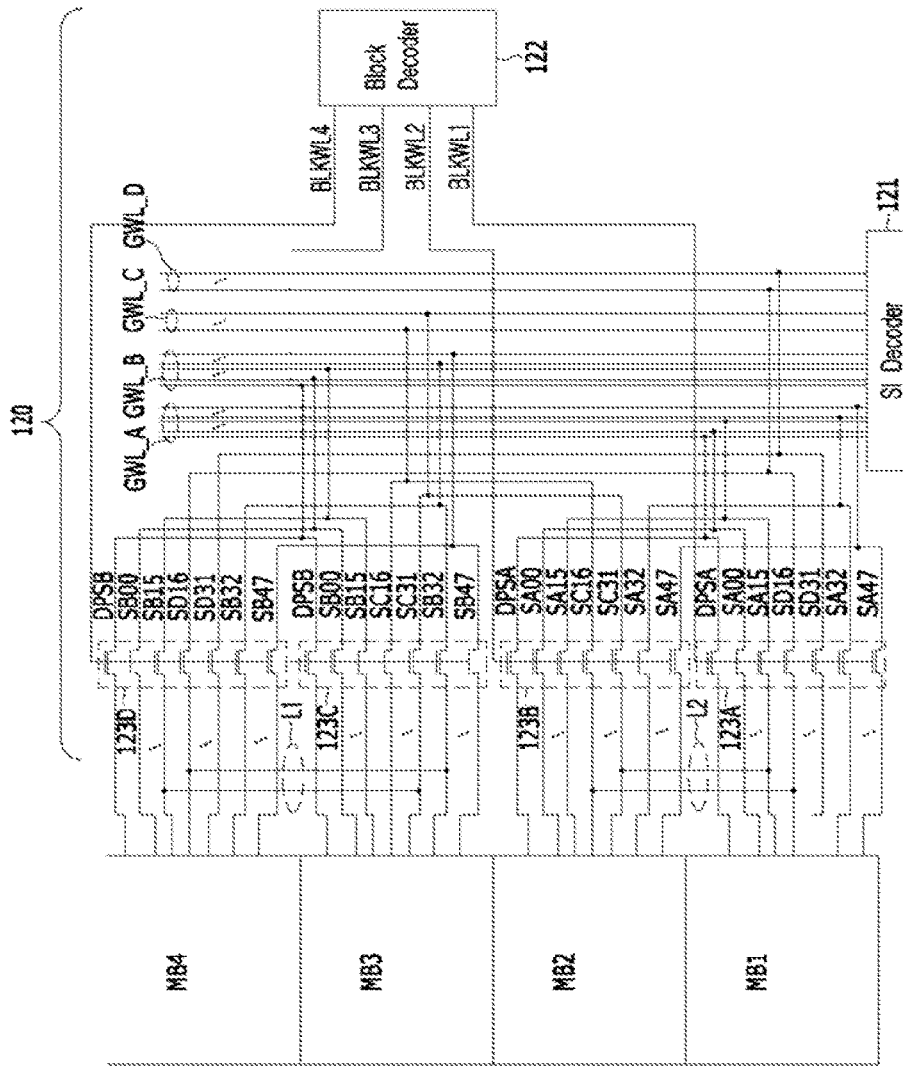
FIG. 4 is a block diagram schematically illustrating a configuration of the row decoder shown in FIG. 1, according to an embodiment of the invention.

FIG. 4 is a block diagram schematically illustrating the configuration of the row decoder 120 shown in FIG. 1.

FIG. 4 shows the row decoder 120 from the viewpoint of operations of memory blocks MB1 to MB4, and illustrates, as an example, that the row decoder 120 may have a structure for driving the 4 memory blocks MB1 to MB4.

Referring to FIG. 4, the row decoder 120 may include an SI decoder 121, a block decoder 122, and a plurality of pass transistor stages 123A to 123D.

The SI decoder 121 may output word line driving signals DPSA, SA<00:15>, SA<32:47> and SD<16:31> to global word lines GWL_A and GWL_D in the case where an inputted block address corresponds to the first memory block MB1. The SI decoder 121 may output word line driving signals DPSA, SA<00:15>, SA<32:47> and SC<16:31> to global word lines GWL_A and GWL_C in the case where an inputted block address corresponds to the second memory block MB2. The SI decoder 121 may output word line driving signals DPSB, SB<00:15>, SB<32:47> and SC<16:31> to global word lines GWL_B and GWL_C in the case where an inputted block address corresponds to the third memory block MB3. The SI decoder 121 may output word line driving signals DPSB, SB<00:15>, SB<32:47> and SD<16:31> to global word lines GWL_B and GWL_D in the case where an inputted block address corresponds to the fourth memory block MB4.

The block decoder 122 may enable one of a plurality of block select signals BLKWL1 to BLKWL4 in response to a block address. One pass transistor stage among the pass transistor stages 123A to 123D may be driven by an enabled block select signal BLKWL.

The pass transistor stages 123A to 123D may include first to fourth pass transistor stages 123A to 123D driven in response to the block select signals BLKWL1 to BLKWL4, respectively.

The first pass transistor stage 123A may include a plurality of pass transistors driven in response to the first block select signal BLKWL1. The drains of the pass transistors included in the first pass transistor stage 123A may be respectively electrically coupled to the global word lines GWL_A and GWL_D, and the sources of the pass transistors included in the first pass transistor stage 123A may be respectively electrically coupled to word lines (not shown) of the first memory block MB1.

In the case where the first memory block MB1 is selected, the first block select signal BLKWL1 may be enabled by the block decoder 122, and the word line driving signals DPSA, SA<00:15>, SA<32:47> and SD<16:31> may be provided from the SI decoder 121 to the global word lines GWL_A and GWL_D. The pass transistors of the first pass transistor stage 123A may be turned on in response to the enabled first block select signal BLKWL1, and may transfer the word line driving signals DPSA, SA<00:15>, SA<32:47> and SD<16:31> to the word lines of the first memory block MB1.

The second pass transistor stage 123B may include a plurality of pass transistors driven in response to the second block select signal BLKWL2. The drains of the pass transistors included in the second pass transistor stage 123B may be electrically coupled to the global word lines GWL_A and GWL_C, respectively, and the sources of the pass transistors included in the second pass transistor stage 123B may be electrically coupled to word lines (not shown) of the second memory block MB2, respectively.

In the case where the second memory block MB2 is selected, the second block select signal BLKWL2 may be enabled by the block decoder 122, and the word line driving signals DPSA, SA<00:15>, SA<32:47> and SC<16:31> may be provided from the SI decoder 121 to the global word lines GWL_A and GWL_C. The pass transistors of the second pass transistor stage 123B may be turned on in response to the enabled second block select signal BLKWL2, and may transfer the word line driving signals DPSA, SA<00:15>, SA<32:47> and SC<16:31> to the word lines of the second memory block MB2.

The third pass transistor stage 123C may include a plurality of pass transistors driven in response to the third block select signal BLKWL3. The drains of the pass transistors included in the third pass transistor stage 123C may be electrically coupled to the global word lines GWL_B and GWL_C, respectively. The sources of the pass transistors included in the third pass transistor stage 123C may be electrically coupled to word lines (not shown) of the third memory block MB3, respectively.

In the case where the third memory block MB3 is selected, the third block select signal BLKWL3 may be enabled by the block decoder 122, and the word line driving signals DPSB, SB<00:15>, SB<32:47> and SC<16:31> may be provided from the SI decoder 121 to the global word lines GWL_B and GWL_C. The pass transistors of the third pass transistor stage 123C may be turned on in response to the enabled third block select signal BLKWL3, and may transfer the word line driving signals DPSB, SB<00:15>, SB<32:47> and SC<16:31> to the word lines of the third memory block MB3.

The fourth pass transistor stage 123D may include a plurality of pass transistors driven in response to the fourth block select signal BLKWL4. The drains of the pass transistors included in the fourth pass transistor stage 123D may be electrically coupled to the global word lines GWL_B and GWL_D, respectively. The sources of the pass transistors included in the fourth pass transistor stage 123D may be electrically coupled to word lines (not shown) of the fourth memory block MB4, respectively.

In the case where the fourth memory block MB4 is selected, the fourth block select signal BLKWL4 may be enabled by the block decoder 122, and the word line driving signals DPSB, SB<00:15>, SB<32:47> and SD<16:31> may be provided from the SI decoder 121 to the global word lines GWL_B and GWL_D. The pass transistors of the fourth pass transistor stage 123D may be turned on in response to the enabled fourth block select signal BLKWL4, and may transfer the word line driving signals DPSB, SB<00:15>, SB<32:47> and SD<16:31> to the word lines of the fourth memory block MB4.

As will be described below with reference to FIGS. 5 to 9, a plurality of pass transistors may be formed in each active region. The pass transistors formed in each active region may be coupled in series while pass transistors adjacent to each other may share a source or a drain.

Further, the pass transistors formed in each active region may be disposed in such a manner that pass transistors to be driven by the same block select signal BLKWL are not adjacent to each other and pass transistors to be driven by different block select signals BLKWL are adjacent to each other. Accordingly, a pair of pass transistors to be driven by different block select signals BLKWL may share one drain, and a pair of pass transistors to be driven by different block select signals BLKWL may share one source.

In FIG. 4, it is illustrated that the word line driving signals DPSA, SA<00:15>, SA<32:47>, DPSB, SB<00:15>, SB<32:47>, SC<16:31> and SD<16:31> may be each provided in common to the drains of a pair of pass transistors to be driven by different block select signals BLKWL. This means that each pair of pass transistors to be driven by different block select signals BLKWL may share one drain.

In FIG. 4, lines designated by the reference symbols L1 and L2 represent that each pair of pass transistors to be driven by different block select signals BLKWL may share a source. In particular, it is noted that the lines L1 and L2 may not be physical coupling elements such as wiring lines but may represent electrically coupled states of pass transistors sharing sources.

According to an embodiment, an inactive region may be reduced by forming a plurality of pass transistors in each active region, which reduces the effective area of the pass transistors. Therefore, the chip size of memory devices may decrease. Such technical characteristics will be described below in detail with reference to FIGS. 5 to 9.

Figure 5:
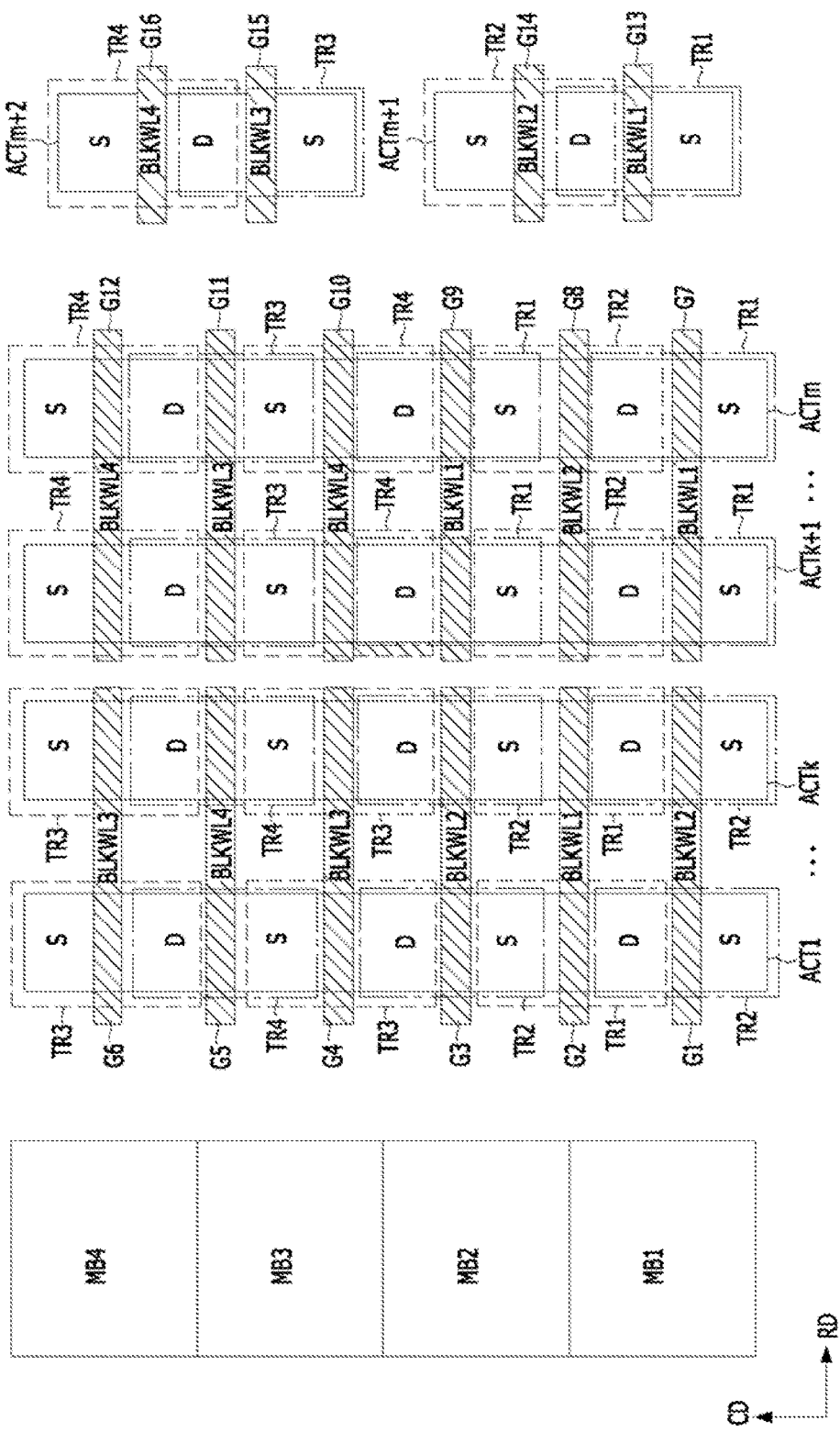
FIG. 5 is a diagram schematically illustrating the layout pattern of the pass transistor stages shown in FIG. 4, according to an embodiment of the invention.

FIG. 5 is a diagram schematically illustrating the layout pattern of the pass transistors included in the pass transistor stages 123A to 123D shown in FIG. 4.

Referring to FIG. 5, the plurality of memory blocks MB1 to MB4 may be arranged in the column direction CD.

As described above with reference to FIGS. 2 and 3, in each of the memory blocks MB1 to MB4, one or more cell strings including the drain select transistors DST, the plurality of memory cells DC and MC00 to MC47 and the source select transistors SST disposed three-dimensionally may be formed. In addition, in each of the memory blocks MB1 to MB4, the drain select lines DSL, a plurality of word lines DWL and WL00 to WL47 and the source select lines SSL coupled to the gates of the drain select transistors DST, the plurality of memory cells DC and MC00 to MC47 and the source select transistors SST and stacked in the height direction VD, may be formed.

A plurality of first active regions ACT1 to ACTm (m is an integer equal to or greater than 2) extending in the column direction CD may be formed on one side of the memory blocks MB1 to MB4. For example, the first active regions ACT1 to ACTm may have a line shape extending in the column direction CD.

The first active regions ACT1 to ACTm as substrate portions surrounded by an isolation layer may be arranged in the row direction RD perpendicular to the column direction CD.

For example, four sources S and three drains D may be alternately disposed in the column direction CD in each of the first active regions ACT1 to ACTm. Gates G1 to G12 may be disposed between drains D and sources S that are adjacent to each other in the column direction CD. While FIG. 5 shows, as an example, that four sources S and three drains D are alternately disposed in each of the first active regions ACT1 to ACTm, it is to be noted that three or more sources S and two or more drains D may be provided to be alternately disposed in each of the first active regions ACT1 to ACTm.

The gates G1 to G6 may traverse side by side the first active regions ACT1 to ACTk in the row direction RD, and the gates G7 to G12 may traverse side by side the first active regions ACTk+1 to ACTm in the row direction RD.

Different block select signals BLKWL may be inputted to gates which are adjacent to each other in the column direction CD. For example, the first block select signal BLKWL1 may be inputted to the gate G2, and the second block select signal BLKWL2 may be inputted to the gates G1 and G3 which are adjacent to the gate G2 in the column direction CD.

In the pass transistor stages 123A to 123D, second active regions ACTm+1 and ACTm+2 having a different shape from the first active regions ACT1 to ACTm may be additionally formed. Unlike the first active regions ACT1 to ACTm, in each of the second active regions ACTm+1 and ACTm+2, one drain D and two sources S may be formed. While FIG. 5 shows as an example that two sources S and one drain D are formed in each of the second active regions ACTm+1 and ACTm+2, it is to be noted that one source S and one drain D may be formed in each of the second active regions ACTm+1 and ACTm+2.

Gates G13 and G14 may be disposed between the drain D and the sources S that are formed in the second active region ACTm+1, and gates G15 and G16 may be disposed between the drain D and the sources S that are formed in the second active region ACTm+2. The gates G13 and G14 may traverse side by side the second active region ACTm+1 in the row direction RD. The gates G15 and G16 may traverse side by side the second active region ACTm+2 In the row direction RD.

Different block select signals BLKWL may be inputted to two gates G that traverse each of the second active regions ACTm+1 and ACTm+2. For example, the first block select signal BLKWL1 may be inputted to one gate G13 of the gates G13 and G14 that traverse the second active region ACTm+1, and the second block select signal BLKWL2 may be inputted to the other gate G14. Further, the third block select signal BLKWL3 may be inputted to one gate G15 of the gates G15 and G16 that traverse the second active region ACTm+2, and the fourth block select signal BLKWL4 may be inputted to the other gate G16.

The gates G2, G7, G9 and G13 to which the first block select signal BLKWL1 may be inputted to construct pass transistors TR1 for transferring word line driving signals to the first memory block MB1, along with the sources S and the drains D disposed on both ends thereof. The gates G1, G3, G8 and G14 to which the second block select signal BLKWL2 may be inputted to construct pass transistors TR2 for transferring word line driving signals to the second memory block MB2, along with the sources S and the drains D disposed on both ends thereof. The gates G4, G6, G11 and G15 to which the third block select signal BLKWL3 may be inputted to construct pass transistors TR3 for transferring word line driving signals to the third memory block MB3, along with the sources S and the drains D disposed on both ends thereof. The gates G5, G10, G12 and G16 to which the fourth block select signal BLKWL4 may be inputted to construct pass transistors TR4 for transferring word line driving signals to the fourth memory block MB4, along with the sources S and the drains D disposed on both ends thereof.

In the pass transistors disposed in the first active regions ACT1 to ACTm, pass transistors disposed at inner parts of the first active regions ACT1 to ACTm may share sources S with pass transistors disposed adjacent to them. Also, pass transistors disposed at both ends of the first active regions ACT1 to ACTm may not share sources S with pass transistors disposed adjacent to them. The pass transistors disposed in the second active regions ACTm+1 and ACTm+2 may not share sources S with pass transistors disposed adjacent to them.

Pass transistors that do not share sources S with other pass transistors, such as the pass transistors disposed at both ends of the first active regions ACT1 to ACTm and the pass transistors disposed in the second active regions ACTm+1 and ACTm+2, may be electrically coupled to the word lines of 2 or 3 memory cells adjacent to the drain select transistors DST, and may individually transfer word line driving signals to the 2 or 3 memory cells adjacent to the drain select transistors DST.

Figure 6:
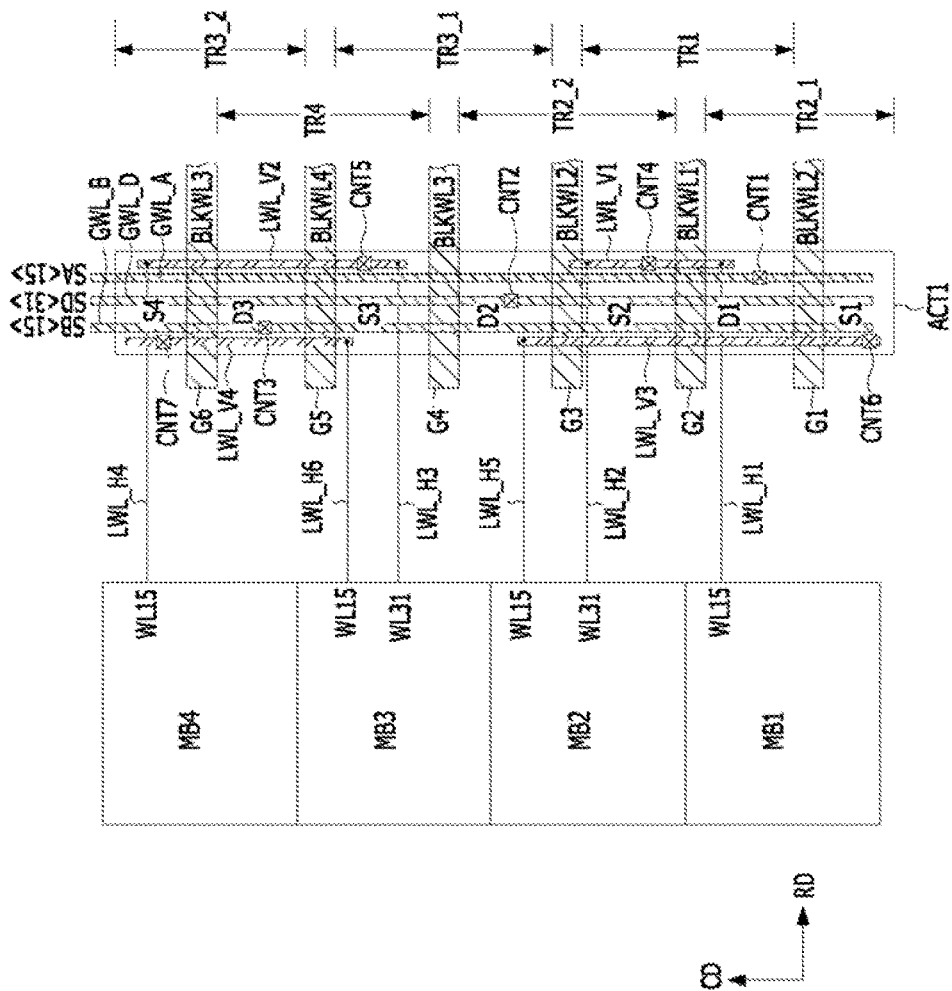
FIG. 6 is a diagram illustrating pass transistors disposed in a first active region ACT1 shown in FIG. 5 and the layout structure of wiring lines associated therewith, according to an embodiment of the invention.

FIG. 6 is a diagram illustrating the layout structure of wiring lines associated with the pass transistors disposed in the first active region ACT1 of FIG. 5.

The wiring lines associated with the pass transistors disposed in the remaining first active regions ACT2 to ACTm may have a similar layout structure to the structure shown in FIG. 6.

Referring to FIG. 6, a plurality of pass transistors TR2_1, TR1, TR2_2, TR3_1, TR4 and TR3_2 may be disposed in the first active region ACT1. The pass transistors TR2_1, TR1, TR2_2, TR3_1, TR4 and TR3_2 may be coupled in series so that adjacent pass transistors may share one of a source S and a drain D. Accordingly, the sources S and the drains D of adjacent pass transistors may have an opposite disposition.

In two pass transistors which share a drain D or a source S, different block select signals BLKWL may be inputted to their respective gates G. For example, in the pass transistors TR2_1 and TR1 that share a drain D1, the second block select signal BLKWL2 may be inputted to the gate G1 of the pass transistors TR2_1, while the first block select signal BLKWL1 may be inputted to the gate G2 of the pass transistor TR1. Similarly, in the pass transistors TR1 and TR2_2 which share a source S2, the first block select signal BLKWL1 may be inputted to the gate G2 of the pass transistors TR1, while the second block select signal BLKWL2 may be inputted to the gate G3 of the pass transistor TR2_2.

The global word lines GWL_A, GWL_D and GWL_B extending in the column direction CD may be formed in a metal layer lying over the gates G1 to G6. The global word lines GWL_A, GWL_D and GWL_B may transfer the word line driving signals SA<15>, SD<31> and SB<15> provided from the SI decoder 121 (see FIG. 4) in the column direction CD.

The global word line GWL_A may be electrically coupled to the common drain D1 of the pass transistors TR2_1 and TR1 through a contact plug CNT1, and may provide the word line driving signal SA<15> to the common drain D1. The global word line GWL_D may be electrically coupled to a common drain D2 of the pass transistors TR2_2 and TR3_1 through a contact plug CNT2, and may provide the word line driving signal SD<31> to the common drain D2.

The global word line GWL_B may be electrically coupled to a common drain D3 of the pass transistors TR4 and TR3_2 through a contact plug CNT3, and may provide the word line driving signal SB<15> to the common drain D3.

The common source S2 of the pass transistors TR1 and TR2_2 may be electrically coupled to the word line WL15 of the first memory block MB1 and the word line WL31 of the second memory block MB2 through driving signal lines LWL_V1, LWL_H1 and LWL_H2. The pass transistor TR1 may transfer the word line driving signal SA<15> inputted to the drain D1 thereof, to the word line WL15 of the first memory block MB1 and the word line WL31 of the second memory block MB2, through the source S2 and the driving signal lines LWL_V1, LWL_H1 and LWL_H2, in response to the first block select signal BLKWL1. The pass transistor TR2_2 may transfer the word line driving signal SD<31> inputted to the drain D2 thereof, to the word line WL15 of the first memory block MB1 and the word line WL31 of the second memory block MB2, through the source S2 and the driving signal lines LWL_V1, LWL_H1 and LWL_H2, in response to the second block select signal BLKWL2.

Similarly, a common source S3 of the pass transistors TR3_1 and TR4 may be electrically coupled to the word line WL31 of the third memory block MB3 and the word line WL15 of the fourth memory block MB4 through driving signal lines LWL_V2, LWL_H3 and LWL_H4. The pass transistor TR3_1 may transfer the word line driving signal SD<31> inputted to the drain D2 thereof, to the word line WL31 of the third memory block MB3 and the word line WL15 of the fourth memory block MB4, through the source S3 and the driving signal lines LWL_V2, LWL_H3 and LWL_H4, in response to the third block select signal BLKWL3. The pass transistor TR4 may transfer the word line driving signal SB<15> inputted to the drain D3 thereof, to the word line WL31 of the third memory block MB3 and the word line WL15 of the fourth memory block MB4, through the source S3 and the driving signal lines LWL_V2, LWL_H3 and LWL_H4, in response to the fourth block select signal BLKWL4.

In word lines WL of memory blocks MB which are electrically coupled to each of the common sources S2 and S3, the word line WL of one memory block MB and the word line WL of the other memory block MB may be different from each other in their stack positions. For example, in the word line WL15 of the first memory block MB1 and the word line WL31 of the second memory block MB2 which are electrically coupled to the common source S2, the word line WL15 of the first memory block MB1 may be disposed in a higher layer than the word line WL31 of the second memory block MB2. Similarly, in the word line WL31 of the third memory block MB3 and the word line WL15 of the fourth memory block MB4 which are electrically coupled to the common source S3, the word line WL31 of the third memory block MB3 may be disposed in a lower layer than the word line WL15 of the fourth memory block MB4.

Since word lines of memory blocks which are coupled in common to one common source may be disposed in different layers, word line driving signals may be applied to the respective memory blocks in different patterns. Accordingly, word line driving signals (word line voltages) may be provided such that a disturbance does not occur in one memory block while a program operation is performed in another memory block. These features will be described later in more detail with reference to FIGS. 10 to 12.

The pass transistors TR2_1 and TR3_2 which are positioned at both ends of the first active region ACT1 may not share sources S with other pass transistors due to a positional issue. Each of the pass transistors TR2_1 and TR3_2 which are positioned at both ends of the first active region ACT1 may be electrically coupled to one of the word lines of memory blocks, and may individually transfer a word line driving signal to the one word line.

For example, the source S1 of the pass transistor TR2_1 may be electrically coupled to the word line WL15 of the second memory block MB2 through driving signal lines LWL_V3 and LWL_H5, and the pass transistors TR2_1 may transfer the word line driving signal SA<15> inputted to the drain D1 thereof, to the word line WL15 of the second memory block MB2, through the source S1 and the driving signal lines LWL_V3 and LWL_H5, in response to the second block select signal BLKWL2.

Similarly, a source S4 of the pass transistor TR3_2 may be electrically coupled to the word line WL15 of the third memory block MB3 through driving signal lines LWL_V4 and LWL_H6, and the pass transistors TR3_2 may transfer the word line driving signal SB<15> inputted to the drain D3 thereof, to the word line WL15 of the third memory block MB3, through the source S4 and the driving signal lines LWL_V4 and LWL_H6, in response to the third block select signal BLKWL3.

Pass transistors that do not share sources S with other pass transistors, such as the pass transistors TR2_1 and TR3_2, may be electrically coupled to the word lines of 2 or 3 memory cells adjacent to the drain select transistors DST, and may individually transfer word line driving signals to these memory cells. This will be described in more detail later with reference to FIGS. 13 and 14.

The driving signal lines LWL_V1 to LWL_V4 and LWL_H1 to LWL_H6 may be electrically coupled between the sources S1 to S4 of the pass transistors TR2_1, TR1, TR2_2, TR3_1, TR4 and TR3_2 and the memory blocks MB1 to MB4, and may transfer the word line driving signals SA<15>, SD<31> and SB<15> provided to the sources S1 to S4 of the pass transistors TR2_1, TR1, TR2_2, TR3_1, TR4 and TR3_2, to the memory blocks MB1 to MB4.

The driving signal lines LWL_V1 to LWL_V4 and LWL_H1 to LWL_H6 may include, for example, first signal lines LWL_V1 to LWL_V4 for transferring the word line driving signals SA<15>, SD<31> and SB<15> in the column direction CD, and second signal lines LWL_H1 to LWL_H6 for transferring the word line driving signals SA<15>, SD<31> and SB<15> in the row direction RD.

The first signal lines LWL_V1 to LWL_V4 may be formed in the same metal layer as the global word lines GWL_A, GWL_D and GWL_B, and may be electrically coupled to the sources S1 to S4 through metal contacts CNT4 to CNT7. The second signal lines LWL_H1 to LWL_H6 may be formed, for example, in a metal layer lying under the first signal lines LWL_V1 to LWL_V4, and may be electrically coupled to the first signal lines LWL_V1 to LWL_V4 and the word lines of the memory blocks MB through metal contacts (not shown).

While FIG. 6 shows as an example that the first signal lines LWL_V1 to LWL_V4 are formed in the same metal layer as the global word lines GWL_A, GWL_D and GWL_B and the second signal lines LWL_H1 to LWL_H6 are formed in a metal layer lying under the global word lines GWL_A, GWL_D and GWL_B, it is noted that the structures of the driving signal lines LWL_V1 to LWL_V4 and LWL_H1 to LWL_H6 may be changed and applied such that the first signal lines LWL_V1 to LWL_V4 are formed in a layer different from the global word lines GWL_A, GWL_D and GWL_B or the second signal lines LWL_H1 to LWL_H6 are formed in a metal layer lying over the first signal lines LWL_V1 to LWL_V4.

A first signal line LWL_V may be electrically coupled to each of the common sources S2 and S3 which are shared by adjacent pass transistors. For example, the first signal line LWL_V1 may be electrically coupled to the common source S2, and the first signal line LWL_V2 may be electrically coupled to the common source S3. Therefore, the number of first signal lines LWL_V may be decreased compared to a structure in which pass transistors do not share sources and thus it is necessary to couple first signal lines LWL_V individually to the sources of the pass transistors.

The layout structure of the driving signal lines LWL_V and LWL_H may be changed into various shapes, and replaceable embodiments will be described below with reference to FIGS. 7 to 9.

Figure 7:
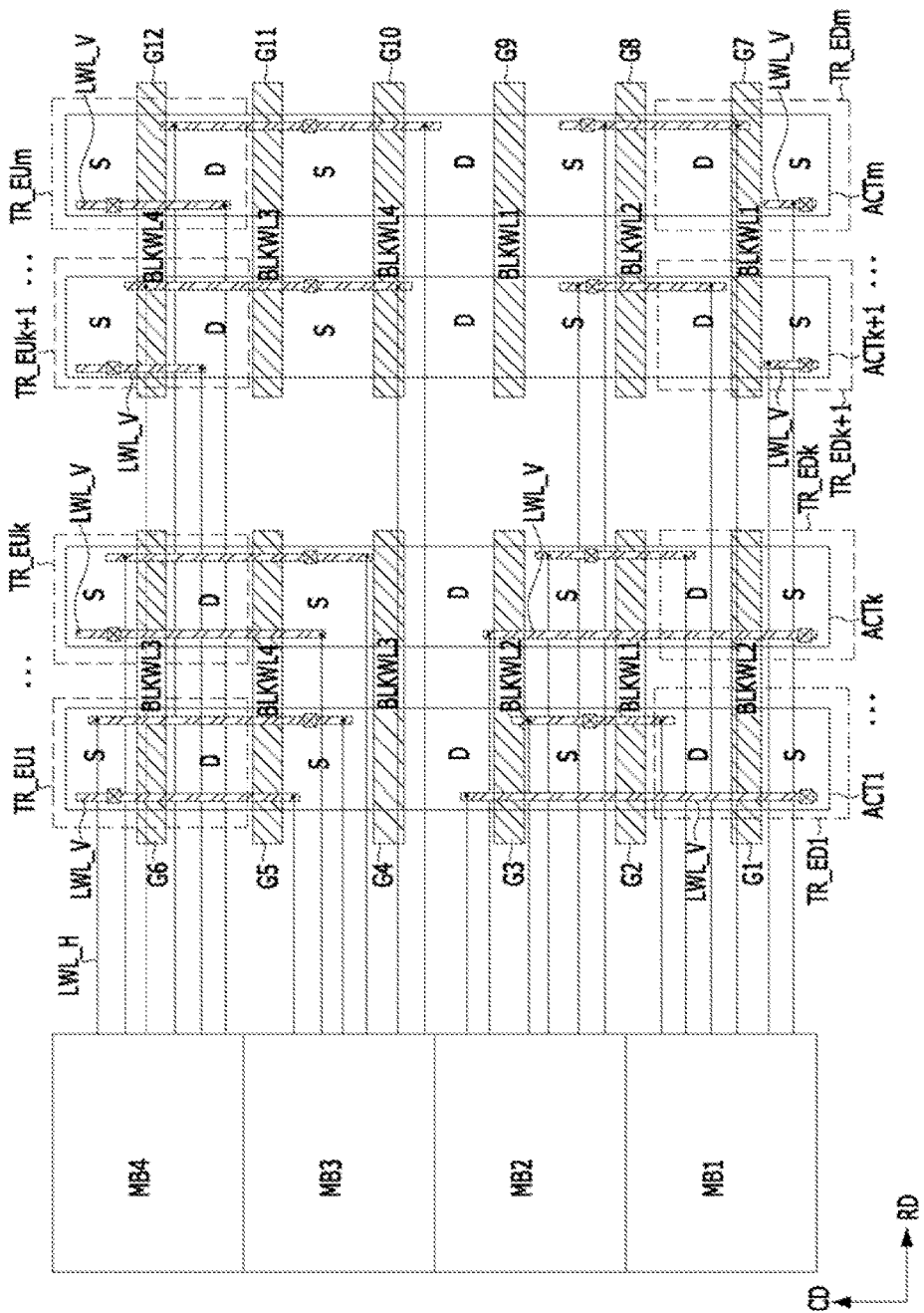
FIGS. 7 to 9 are diagrams illustrating various layout patterns of driving signal lines, according to an embodiment of the invention.
Figure 8:
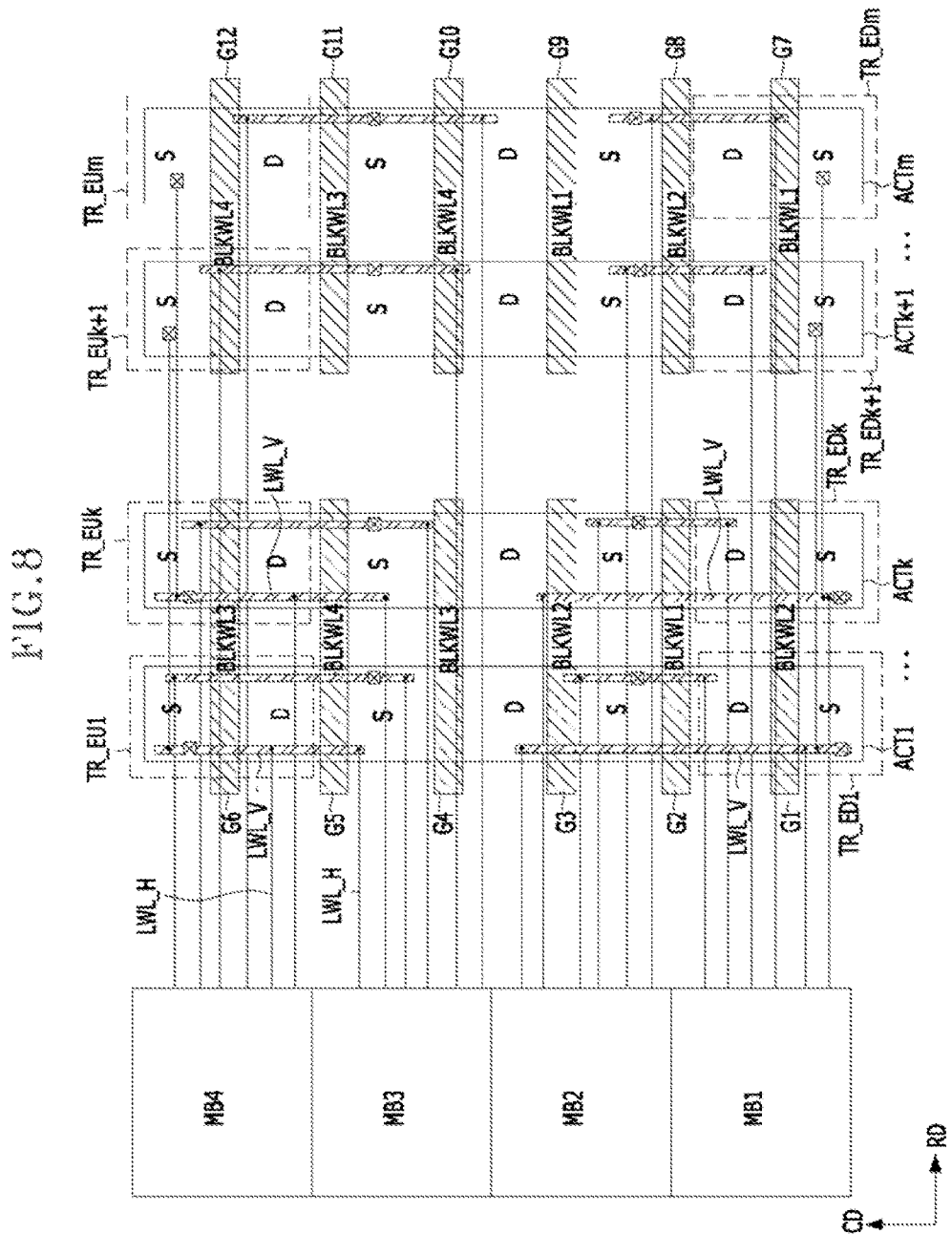
Figure 9:
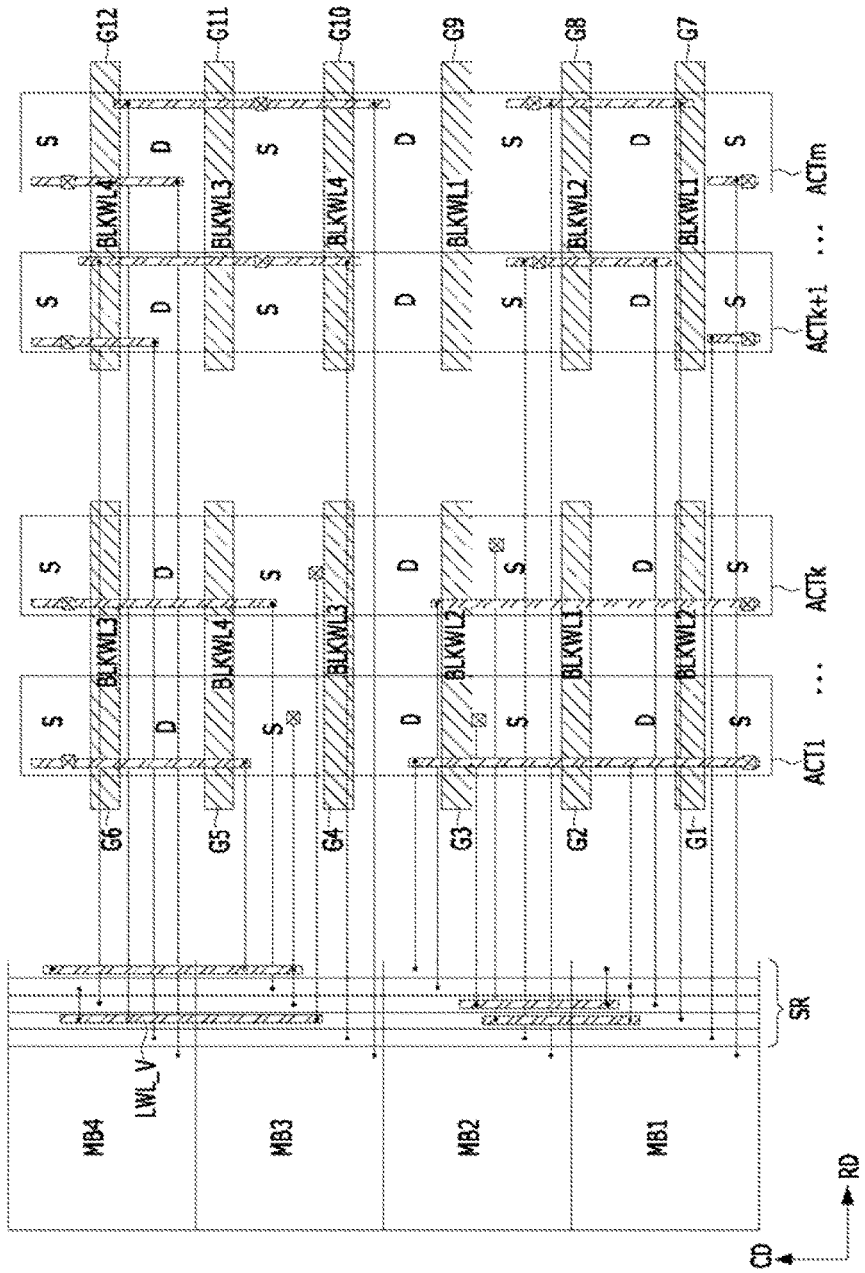

FIGS. 7 to 9 are diagrams illustrating various layout patterns of driving signal lines LWL_V and LWL_H.

In the following descriptions to be made with reference to FIGS. 7 to 9, repeated descriptions for configurations already described above with reference to FIGS. 5 and 6 will be omitted.

Referring to FIG. 7, first signal lines LWL_V of driving signal lines LWL_V and LWL_H may be disposed on the first active regions ACT1 to ACTm in such a way as to overlap with the first active regions ACT1 to ACTm. The first signal lines LWL_V may be individually coupled to corresponding sources S of edge pass transistors TR_EU1 to TR_EUm and TR_ED1 to TR_EDm which are positioned at both ends of the first active regions ACT1 to ACTm. The first signal lines LWL_V coupled to the sources S of the edge pass transistors TR_EU1 to TR_EUm and TR_ED1 to TR_EDm each may be electrically coupled to one of the word lines of the memory blocks MB through a second signal line LWL_H.

The edge pass transistors TR_EU1 to TR_EUm and TR_ED1 to TR_EDm each may be electrically coupled to one of the word lines DWL, WL00 and WL01 of the outermost main memory cell MC00 adjoining the drain select transistor DST, which is susceptible to a disturbance and the memory cells DC and MC01 adjacent thereto, and may provide word line driving signals individually to the word lines DWL, WL00 and WL01 of the memory cells DC, MC00 and MC01.

Similarly to the edge pass transistors TR_EU1 to TR_EUm and TR_ED1 to TR_EDm, each of the pass transistors disposed in the second active regions ACTm+1 and ACTm+2 of FIG. 5 may be electrically coupled to one of the word lines DWL, WL00 and WL01 of the memory cells DC, MC00 and MC01.

Referring to FIG. 8, the edge pass transistors TR_EU1 to TR_EUm and TR_ED1 to TR_EDm which are positioned at both ends of the first active regions ACT1 to ACTm may be paired so that each pair of edge pass transistors may be driven by different block select signals BLKWL. Each pair of edge pass transistors may be electrically coupled to a first signal line LWL_V. Each of the first signal lines LWL_V may be electrically coupled to a pair of word lines which are included in different memory blocks MB, through two second signal lines LWL_H. For example, a first edge pass transistor TR_EU1 to be driven by the third block select signal BLKWL3 and a (k+1)th edge pass transistor TR_EUk+1 to be driven by the fourth block select signal BLKWL4 may be paired with each other and may be electrically coupled to a first signal line LWL_V. The first signal line LWL_V may be electrically coupled to a word line included in the third memory block MB3 and a word line included in the fourth memory block MB4, through two second signal lines LWL_H.

Therefore, since it may be sufficient to form only a first signal line LWL_V for two edge pass transistors, the number of first signal lines LWL_V may be decreased. Accordingly, since the space/distance between first signal lines LWL_V may be widened, interference between the first signal lines LWL_V may be reduced.

Referring to FIG. 9, some of the first signal lines LWL_V of driving signal lines LWL_V and LWL_H may be disposed on, instead of the first active regions ACT1 to ACTm, a slimming region SR. As described above with reference to FIG. 3, the slimming region SR may be a region where the edge portions of the drain select lines DSL, the word lines DWL and WL and the source select lines SSL of the memory blocks MB may be exposed in the form of a stair.

According to the embodiment shown in FIG. 9, since some of the first signal lines LWL_V may be disposed on the slimming region SR, the number of first signal lines LWL_V disposed on the first active regions ACT1 to ACTm may be decreased. Accordingly, since the space/distance between first signal lines LWL_V may be widened, interference between the first signal lines LWL_V may be reduced.

Figure 10:
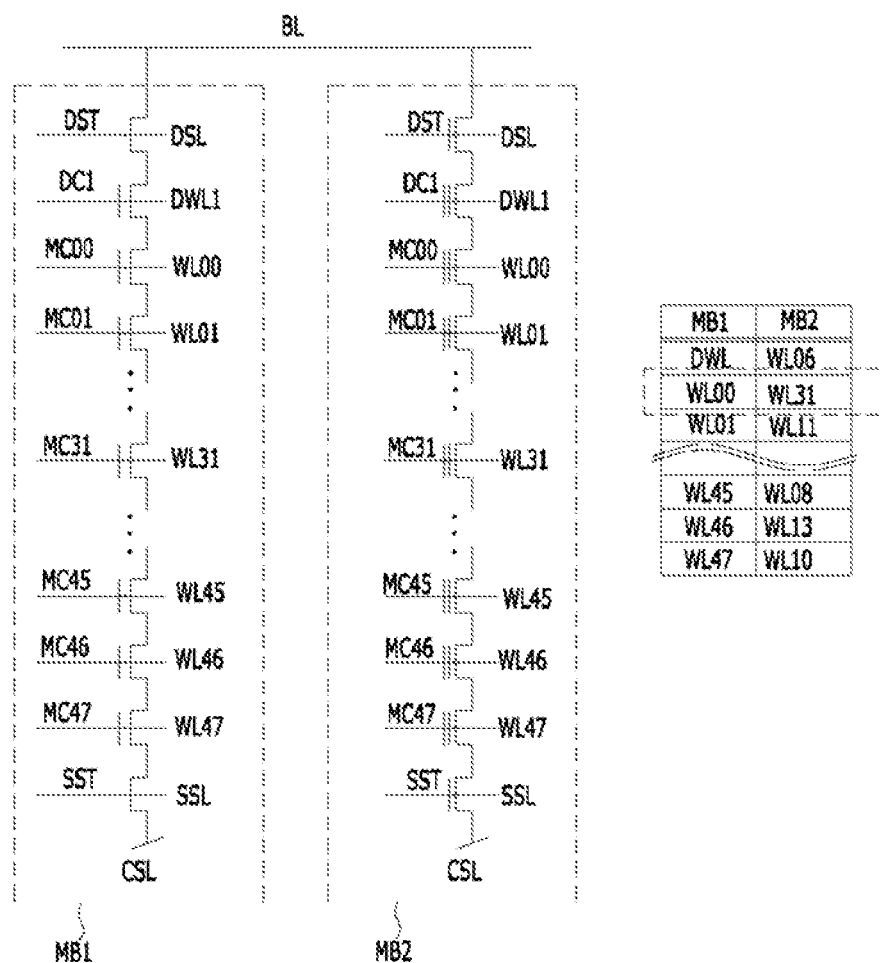
FIG. 10 is a diagram illustrating the relationship between the word lines of a first memory block MB1 and the word lines of a second memory block MB2, according to an embodiment of the invention.

FIG. 10 illustrates a relationship between the word lines of the first and second memory blocks MB1, MB2.

In the circuit diagram shown on the left side of FIG. 10, there are illustrated only one cell string for each of the first and second memory blocks MB1, MB2. The cell strings of each of the first and second memory blocks MB1, MB2 may be coupled to the same bit line BL.

In the table shown on the right side of FIG. 10, word lines DWL, WL of the left column may be the word lines of the first memory block MB1, and word lines DWL, WL of the right column may be the word lines of the second memory block MB2. Further, word lines DWL, WL given in the same row may be a pair of word lines coupled in common to one of the sources of pass transistor stages and may be provided with the same word line driving signal.

Referring to FIG. 10, the word lines DWL and WL00 to WL47 of the first memory block MB1 and the word lines DWL and WL00 to WL47 of the second memory block MB2 may be paired in a one-to-one basis, and each pair of word lines may be coupled in common to one of the sources of the pass transistor stages and be provided with the same word line driving signal.

For example, the word line WL00 of the first memory block MB1 and the word line WL31 of the second memory block MB2 may be paired with each other and coupled in common to one source of the pass transistor stages. The same word line driving signal may be transferred to the word lines WL00 and WL31 from two pass transistors which share the source.

In particular, in order to prevent the outermost main memory cell MC00 adjoining the drain select transistor DST, which may be susceptible to a disturbance, from being programmed in an undesired manner, each of the word lines DWL, WL00 and WL01 coupled to the outermost main memory cell MC00 and the adjacent memory cells DC and MC01 of the first memory block MB1 may be paired with one of the word lines WL02 to WL47 of the second memory block MB2, that is one of the remaining word lines other than the word lines DWL, WL00 and WL01 of the second memory block MB2. Each pair of word lines may be transferred with the same word line driving signal from the pass transistor stages. For example, the word lines DWL, WL00 and WL01 of the first memory block MB1 may be paired with the word lines WL06, WL31 and WL11 of the second memory block MB2, respectively. Respective pairs of word lines may be transferred with the same word line driving signals from the pass transistor stages.

Accordingly, in the case where the main memory cell MC31 of the second memory block MB2 is programmed and a program voltage is transferred to the outermost main word line WL00 of the first memory block MB1 which is provided with the same word line driving signal as the main word line WL31 of the second memory block MB2, a program prohibition bias may be applied to the word lines DWL, WL01 of the unselected memory block MB1 which are adjacent to the main word line WL00 so that the main memory cell MC00 of the unselected memory block MB1 may not be programmed.

Figure 11:
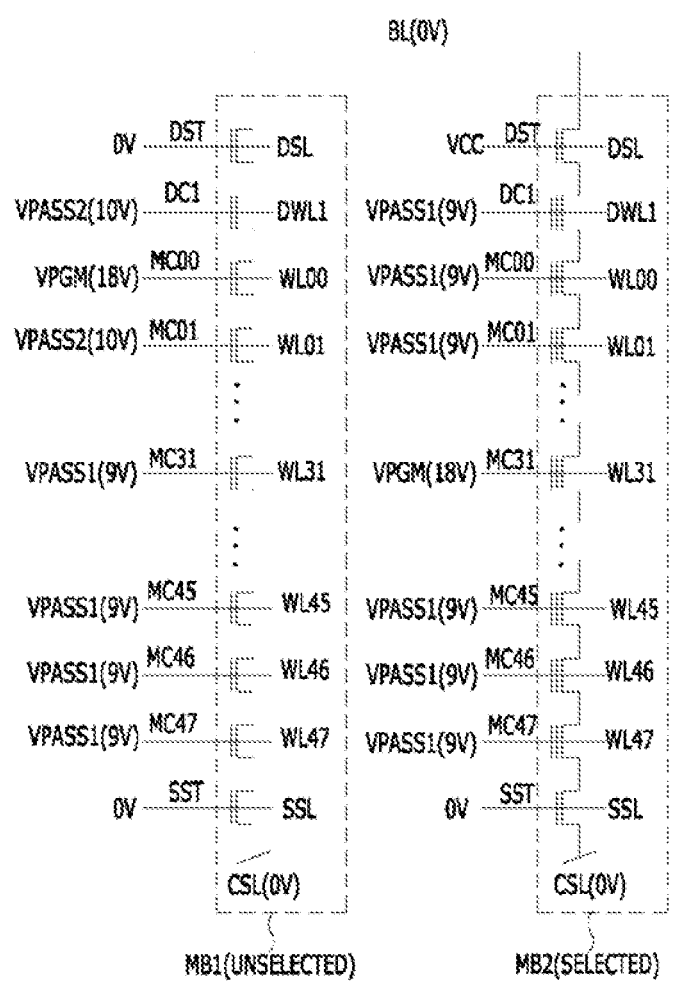
FIGS. 11 and 12 are diagrams illustrating bias application states in the case where the memory cell MC31 of the second memory block MB2 in FIG. 10 is programmed, according to an embodiment of the invention.
Figure 12:
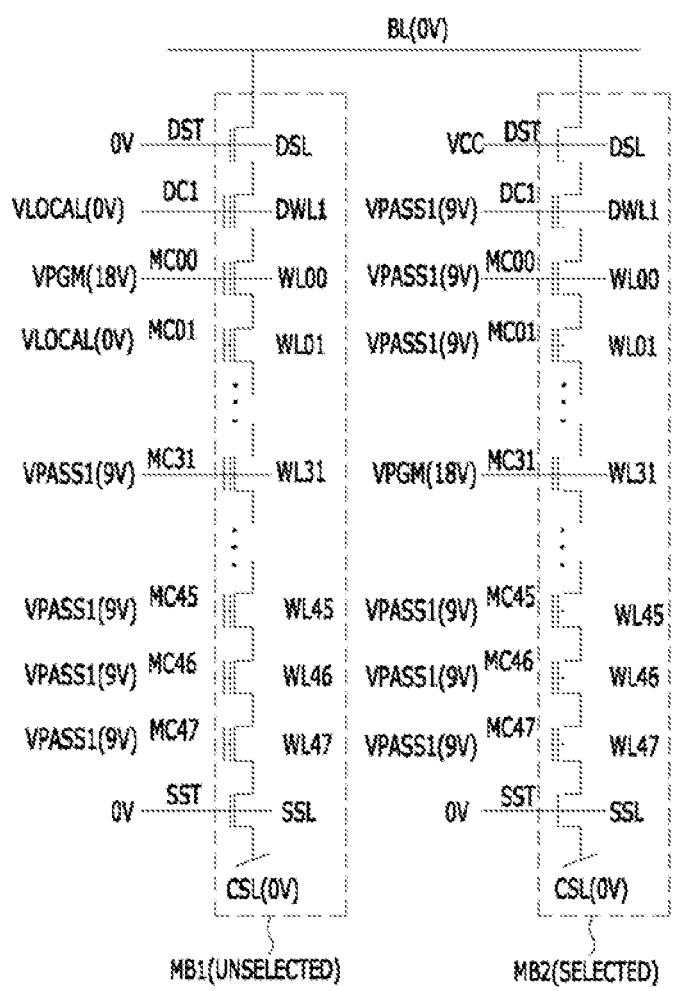

FIGS. 11 and 12 are diagrams illustrating bias application states in the case where the memory cell MC31 of the second memory block MB2 in FIG. 10 is programmed.

Referring to FIG. 11, in the case where the main memory cell MC31 of the second memory block MB2 is programmed, a ground voltage of 0V may be applied to the bit line BL, and a power supply voltage VCC may be applied to the drain select line DSL of the selected memory block MB2. Further, the ground voltage of 0V may be applied to the drain select line DSL of the unselected memory block MB1 and the common source lines CSL of the memory blocks MB1, MB2.

A program voltage VPGM as a word line driving signal may be applied to the main word line WL31 of the second memory block MB2 and the main word line WL00 of the first memory block MB1 which are coupled in common to a source of the pass transistor stages. A first pass voltage VPASS1 as a word line driving signal, lower than the program voltage VPGM, may be applied to the word lines WL02 to WL47 of the first memory block MB1 and word lines of the second memory block MB2 which are coupled in common to sources of the pass transistor stages. A second pass voltage VPASS2 as a word line driving signal, lower than the program voltage VPGM and higher than the first pass voltage VPASS1, may be applied to the word lines DWL and WL01 of the first memory block MB1 and the word lines WL06 and WL11 of the second memory block MB2 which are coupled in common to sources of the pass transistor stages. For example, the program voltage VPGM may be 18V, the first pass voltage VPASS1 may be 9V, and the second pass voltage VPASS2 may be 10V.

Accordingly, since the second pass voltage VPASS2 and the program voltage VPGM higher than the first pass voltage VPASS1 may be coupled to the channels of the memory cells DC, MC00 and MC01 of the first memory block MB1, potential differences between the boosted channel voltages of the memory cells DC, MC00 and MC01 of the first memory block MB1 and the program voltage VPGM applied to the word line WL00 of the first memory block MB1 may be smaller than a potential difference necessary for F–N tunneling. In this way, the outermost main memory cell MC00 of the first memory block MB1 may be prevented to be programmed unintentionally.

Referring to FIG. 12, a decoupling voltage VLOCAL as a word line driving signal may be applied to the word lines DWL and WL01 of the first memory block MB1 and the word lines WL06 and WL11 of the second memory block MB2 which are coupled in common to sources of the pass transistor stages. For example, the decoupling voltage VLOCAL may be 0V.

Accordingly, as the memory cells DC and MC01 of the first memory block MB1 are turned off, the channel portion of the main memory cell MC00 of the first memory block MB1 may be electrically decoupled from the other channel portions and may become a floating state. Hence, the program voltage VPGM applied to the word line WL00 of the first memory block MB1 may be coupled to the channel of the memory cell MC00 of the first memory block MB1. Therefore, a potential difference between the voltage of the word line WL00 of the first memory block MB1 and the boosted channel voltage of the memory cell MC00 of the first memory block MB1 may be smaller than a potential difference necessary for F–N tunneling, whereby the outermost main memory cell MC00 of the first memory block MB1 may be prevented to be programmed in an unintentional manner.

Figure 13:
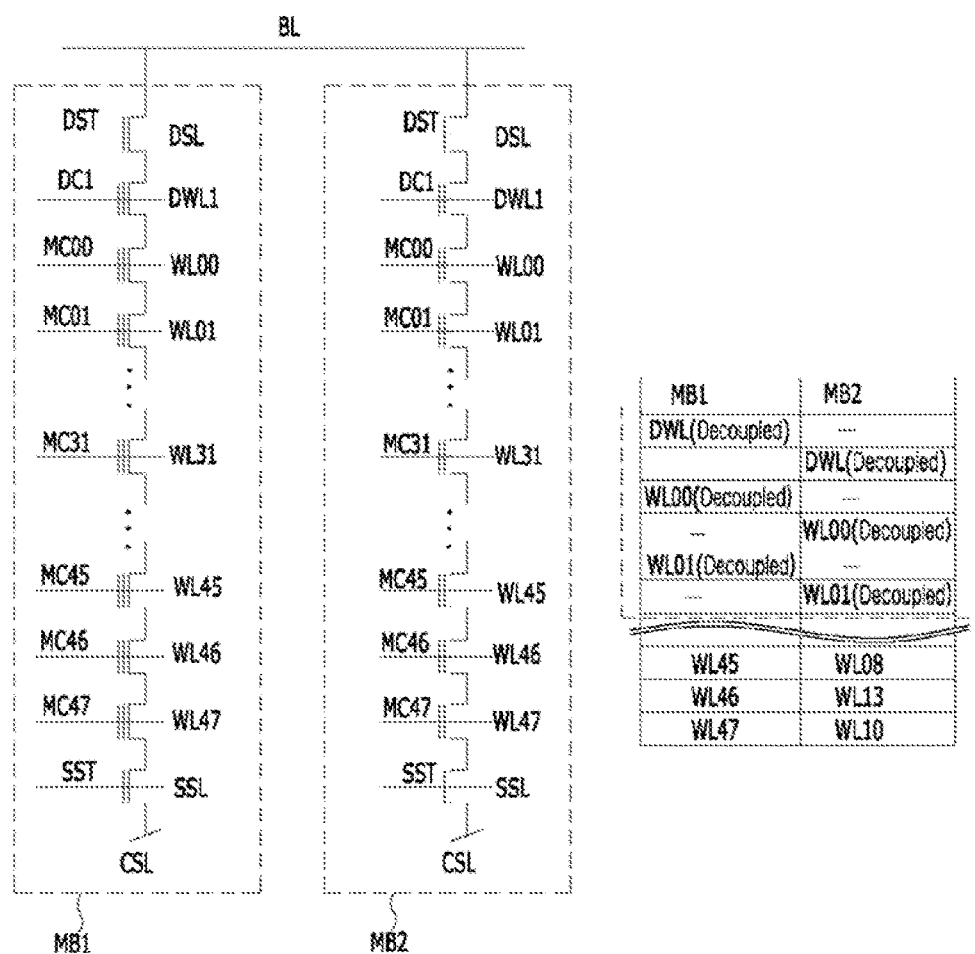
FIG. 13 is a diagram illustrating the relationship between the word lines of a first memory block MB1 and the word lines of a second memory block MB2, according to an embodiment of the invention.

FIG. 13 illustrates a relationship between the word lines of the memory block MB1 and the word lines of the memory block MB2.

For example, in the table of FIG. 13, word lines DWL and WL of the left column may be the word lines of the first memory block MB1, and word lines DWL and WL of the right column may be the word lines of the second memory block MB2. Further, word lines DWL and WL given in the same row may be a pair of word lines that are coupled in common to one of the sources of pass transistor stages and may be provided with the same word line driving signal.

Referring to FIG. 13, for preventing occurrence of a phenomenon that the outermost main memory cells MC00 adjoining the drain select transistors DST, which are susceptible to a disturbance, are programmed in an unintentional manner, the word lines DWL, WL00 and WL01 of the outermost main memory cells MC00 and the adjacent memory cells DC and MC01 included in the first and second memory blocks MB1 and MB2 may be respectively coupled to pass transistors which do not share sources, among the pass transistors of the pass transistor stages, and may be individually provided with word line driving signals from the pass transistor stages.

Each of the word lines DWL, WL00 and WL01 of the outermost main memory cells MC00 and the adjacent memory cells DC and MC01 may be electrically coupled to one of, for example, the edge pass transistors positioned at both ends of the first active regions ACT1 to ACTm or the pass transistors formed in the second active regions ACTm+1 and ACTm+2 shown in FIG. 5, and may be provided with a word line driving signal from one of the edge pass transistors or the pass transistors formed in the second active regions ACTm+1 and ACTm+2.

Meanwhile, the other word lines WL02 to WL47 excluding the word lines DWL, WL00 and WL01 of the outermost main memory cells MC00 and the adjacent memory cells DC and MC01 may be paired so that each pair may include word lines belonging to different memory blocks MB. Each pair of word lines may be coupled in common to a source of the pass transistor stages, and may be transferred with a word line driving signal from two pass transistors sharing the source.

Figure 14:
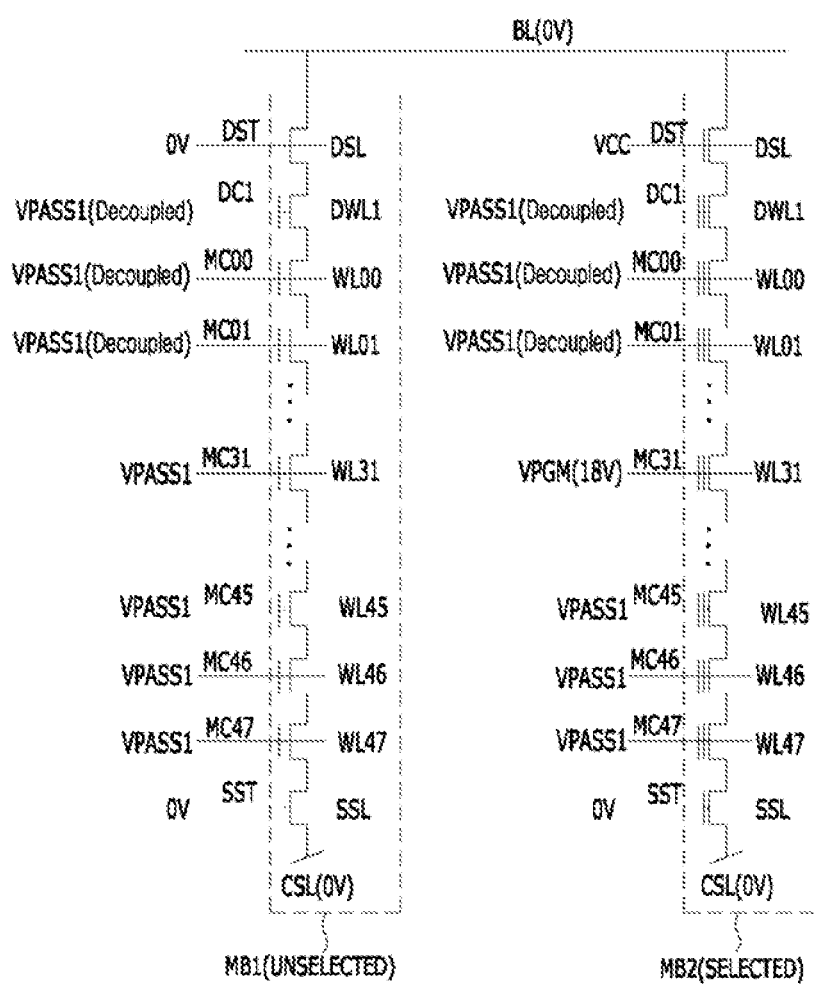
FIG. 14 is a diagram illustrating a bias application state in the case where the memory cell MC31 of the second memory block MB2 in FIG. 13 is programmed, according to an embodiment of the invention.

FIG. 14 illustrates a bias application state in the case where the memory cell MC31 of the second memory block MB2 in FIG. 13 is programmed.

Referring to FIG. 14, in the case where the main memory cell MC31 of the second memory block MB2 is programmed, a ground voltage of 0V may be applied to the bit line BL, and a power supply voltage VCC may be applied to the drain select line DSL of the selected memory block MB2. Further, the ground voltage of 0V may be applied to the drain select line DSL of the unselected memory block MB1 and the common source lines CSL of the memory blocks MB1 and MB2.

A program voltage VPGM as a word line driving signal may be applied to the main word line WL31 of the second memory block MB2 and a word line of the first memory block MB1 which are coupled in common to a source of the pass transistor stages. A first pass voltage VPASS1 as a word line driving signal may be applied to the remaining word lines DWL, WL00 to WL30 and WL32 to WL47 of the second memory block MB2.

Further, the first pass voltage VPASS1 as a word line driving signal may be applied to remaining word lines of the first memory block MB1 other than the word line which may be coupled to the same source as the main word line WL31 of the second memory block MB2, among the word lines DWL and WL00 to WL47 of the first memory block MB1.

Since the word lines DWL, WL00 and WL01 of the first memory block MB1 may be electrically decoupled from the word lines of the second memory block MB2, the first pass voltage VPASS1 may be applied to the word lines DWL, WL00 and WL01 of the first memory block MB1 regardless of word line driving signals applied to the word lines of the second memory block MB2, whereby it is possible to prevent the main memory cell MC00 of the first memory block MB1 to be programmed in an unintentional manner.

Figure 15:
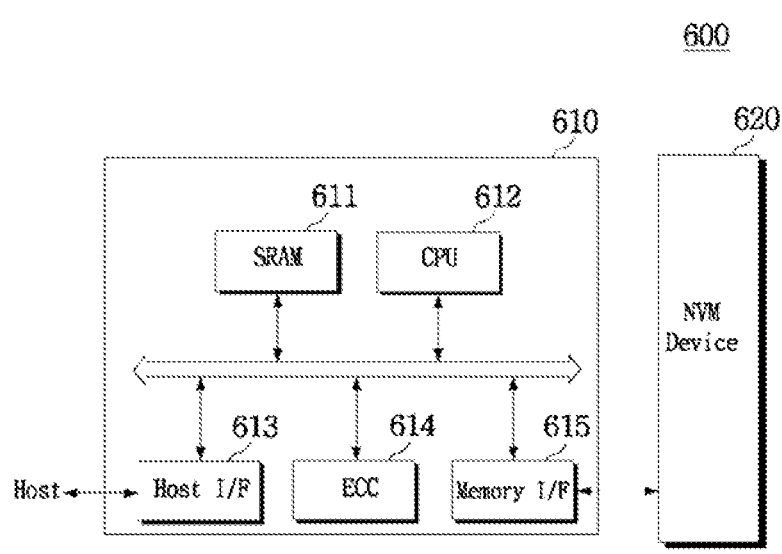
FIG. 15 is a block diagram schematically a memory system including a nonvolatile memory device, according to an embodiment of the invention.

FIG. 15 is a block diagram schematically illustrating a memory system 600 including a nonvolatile memory device 620, according to an embodiment of the invention.

The memory system 600 may also include a memory controller 610. The memory controller 610 may control the nonvolatile memory device 620. By the combination of the nonvolatile memory device 620 and the memory controller 610, a memory card or a solid state disk (SSD) may be provided. An SRAM 611 may be used as the working memory of a central processing unit (CPU) 612. A host interface 613 may include the data exchange protocol of a host which may be coupled with the memory system 600.

An error correction code (ECC) block 614 may detect and correct an error included in the data read out from the nonvolatile memory device 620.

A memory interface 615 may interface with the nonvolatile memory device 620. The CPU 612 may perform general control operations for data exchange of the memory controller 610.

Although not shown, it should become apparent to a person skilled in the art that the memory system 600 may further be provided with a ROM which stores code data for interfacing with the host. The nonvolatile memory device 620 may be provided as a multi-chip package constructed by a plurality of flash memory chips.

The memory system 600 may be used as a storage medium of high reliability having a low probability of an error occurring. In particular, the aforementioned semiconductor memory device may be provided for a memory system such as a solid state disk (SSD). In this case, the memory controller 610 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol.

Figure 16:
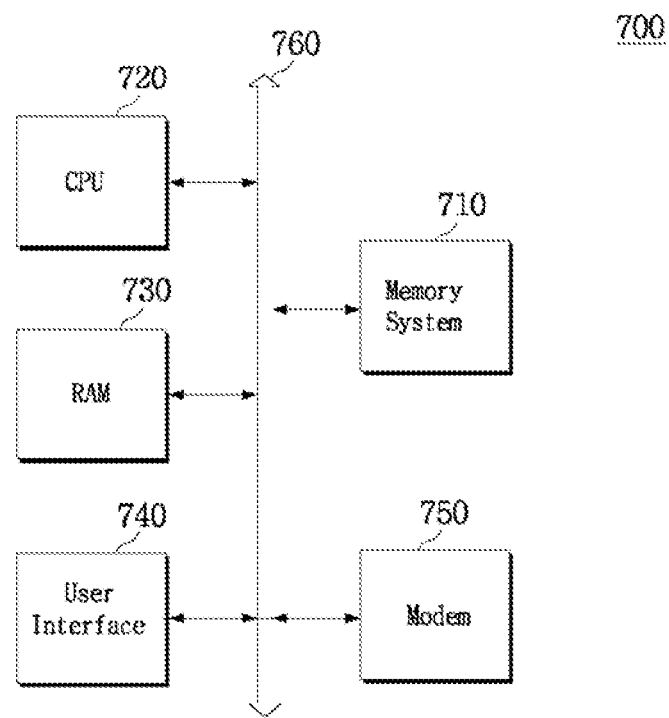
FIG. 16 is a block diagram schematically illustrating a computing system including a nonvolatile memory device, according to an embodiment of the invention.

FIG. 16 is a block diagram schematically illustrating a computing system including a nonvolatile memory device in according to an embodiment.

Referring to FIG. 16, a computing system 700 in according to an embodiment may include a microprocessor (or CPU) 720, a RAM 730, a user interface 740, a modem 750 such as a baseband chipset, and a memory system 710, which are electrically coupled to a system bus 760. In the case where the computing system 700 in according to the embodiment is a mobile device, a battery (not shown) for supplying the operating voltage of the computing system 700 may be additionally provided. Although not shown in the drawing, it should become apparent to a person skilled in the art that the computing system 700 may further comprise an application chipset, a camera image processor (CIS), a mobile DRAM, and so on. The memory system 710 may be configured, for example, as an SSD (solid state drive/disk) which uses a nonvolatile memory to store data. Or also as an example, the memory system 710 may be provided as a fusion flash memory (for example, a OneNAND flash memory).

While various embodiments have been described above, it will be understood to those skilled in the art that the embodiments described are by way of example only. Accordingly, the nonvolatile memory device described herein should not be limited based on the described embodiments. Many other embodiments and variations thereof may be envisaged by those skilled in the art to which the invention pertains without departing from the scope and spirit of the invention as defined by the appended claims.

What is claimed is:

1. A nonvolatile memory device comprising:
a plurality of memory blocks each memory block including a drain select line, word lines and a source select line; and
a pass transistor stage including a plurality of pass transistors for transferring word line voltages to a memory block selected in response to a block select signal, wherein the pass transistors are connected in series and formed in an active region such that each pass transistor shares a drain with a first adjacent pass transistor at one side and shares a source with a second adjacent pass transistor at another side;
wherein a pair of pass transistors which share the source transfer word line driving signals from drains thereof to a pair of word lines included in a different memory block from the one containing the pair of pass transistors.

2. The nonvolatile memory device according to claim 1, wherein, in a pair of pass transistors which share the drain or the source, different block select signals are inputted to a gate of one pass transistor and a gate of the other pass transistor.

3. The nonvolatile memory device according to claim 1, wherein the active region has a line shape extending in the same direction as an arrangement direction of the memory blocks.

4. The nonvolatile memory device according to claim 1, further comprising:
driving signal lines suitable for electrically coupling sources of the pass transistors and word lines of the memory blocks.

5. The nonvolatile memory device according to claim 4, wherein the driving signal lines comprise:
first signal lines suitable for transferring the word line driving signals in a direction parallel to the direction in which the active region extends; and second signal lines suitable for transferring the word line driving signals in a direction perpendicular to the direction in which the active region extends.

6. The nonvolatile memory device according to claim 5, wherein the first signal lines are disposed over the active region.

7. The nonvolatile memory device according to claim 5, wherein each of the memory blocks include a slimming region where edge portions of the drain select line, the word lines and the source select line are exposed in the form of a stair, and the first signal lines are disposed over the slimming region.

8. The nonvolatile memory device according to claim 5, wherein the first signal lines and the second signal lines are disposed in different metal layers.

9. The nonvolatile memory device according to claim 8, further comprising:
global word lines disposed in a direction parallel to the direction in which the active region extends, and suitable for transferring the word line driving signals,
wherein the first signal lines are disposed in the same metal layer as the global word lines.

10. The nonvolatile memory device according to claim 5, wherein the pass transistors comprise:
first pass transistors, each disposed at an end of the active region, and suitable for sharing a drain with an adjacent pass transistor without sharing a source; and
second pass transistors each disposed at an inner part of the active region, and suitable for sharing a drain and a source with adjacent pass transistors.

11. The nonvolatile memory device according to claim 10, wherein each of the first transistors transfer a word line driving signal from the drain thereof to one of word lines of a memory block through the source thereof.

12. The nonvolatile memory device according to claim 10, further comprising:
one or more third pass transistors each including a source and a drain formed in an additional active region defined separately from the active region,
wherein the third pass transistor transfers a word line driving signal from the drain thereof to one of word lines of a memory block, among the memory blocks, through the source thereof.

13. The nonvolatile memory device according to claim 10, wherein the active region is formed in a plural, the first pass transistors are paired to be electrically coupled in common to one of the first signal lines, and each pair of the first pass transistors are driven by different block select signals.

14. The nonvolatile memory device according to claim 12, wherein the word lines of each of the memory blocks comprise:
a plurality of main word lines; and
one or more dummy word lines disposed between the drain select line and the main word lines.

15. The nonvolatile memory device according to claim 14,
wherein, among the word lines, an outermost main word line adjoining the drain select line, an adjacent main word line adjoining the outermost main word line, and the dummy word line are each electrically coupled to one of the first pass transistors and the third pass transistor, and provided with a word line driving signal from the one of the first pass transistors and the third pass transistor, and
wherein, among the word lines, remaining word lines excluding the outermost main word line, the adjacent main word line, and the dummy word line are each electrically coupled to a pair of second pass transistors which share a source, and provided with a word line driving signal from the pair of second pass transistors which share the source.

16. The nonvolatile memory device according to claim 14, wherein each of the main word lines and the dummy word line of each of the memory blocks is electrically coupled to a pair of second pass transistors sharing a source, and is provided with a word line driving signal from the pair of second pass transistors sharing the source.

17. The nonvolatile memory device according to claim 16, wherein, among the memory blocks, an outermost main word line, an adjacent main word line, and a dummy word line of a first memory blocks are paired with remaining word lines of a second memory block excluding an outermost main word line, an adjacent main word line, and a dummy word line of a second memory block, and each pair of word lines are provided with the same word line driving signal from the pass transistor stage.

18. The nonvolatile memory device according to claim 17, wherein, in the case where a remaining word line of the second memory block which is paired with the outermost main word line of the first memory block is selected and a program voltage is provided as a word line driving signal to the unselected outermost main word line of the first memory block, a higher pass voltage is provided as a word line driving signal to the adjacent main word line and the dummy word line of the first memory block than remaining word lines of the first memory block.

19. The nonvolatile memory device according to claim 17, wherein, in the case where a remaining word line of the second memory block which is paired with the outermost main word line of the first memory block is selected and a program voltage is provided as a word line driving signal to the unselected outermost main word line of the first memory block, a decoupling voltage is provided as a word line driving signal to the adjacent main word line and the dummy word line of the first memory block.

20. The nonvolatile memory device according to claim 19, wherein the decoupling voltage is 0V.

* * * * *